(12) United States Patent
Kim

(10) Patent No.: US 7,259,103 B2
(45) Date of Patent: Aug. 21, 2007

(54) FABRICATION METHOD OF POLYCRYSTALLINE SILICON TFT

(75) Inventor: Sang Hyun Kim, Gyeonggi-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 304 days.

(21) Appl. No.: 10/663,805

(22) Filed: Sep. 17, 2003

(65) Prior Publication Data

US 2004/0248422 A1    Dec. 9, 2004

(30) Foreign Application Priority Data

Jun. 3, 2003    (KR) .................. 10-2003-0035577

(51) Int. Cl.
*H01L 21/302*    (2006.01)

(52) U.S. Cl. .............. 438/705; 438/308; 438/378; 438/692; 438/700; 438/734; 438/750; 438/795

(58) Field of Classification Search ............. 438/308, 438/378, 692, 700, 705, 734, 750, 795
See application file for complete search history.

(56) References Cited

U.S. PATENT DOCUMENTS 5,879,976 A * 3/1999 Fujiwara .................... 438/163
6,177,301 B1 * 1/2001 Jung ........................... 438/150
6,200,837 B1 * 3/2001 Ihn et al. .................... 438/166
7,015,122 B2 * 3/2006 Lee ............................. 438/486
2002/0037654 A1 * 3/2002 Hayashi et al. ............. 438/745
2004/0266078 A1 * 12/2004 Kim ............................ 438/166
2005/0130357 A1 * 6/2005 Song et al. .................. 438/197

FOREIGN PATENT DOCUMENTS

| JP | 10-200120 | * 7/1998 |
| JP | 2000-040828 | * 2/2000 |
| JP | 2002-006338 | * 1/2002 |

* cited by examiner

*Primary Examiner*—George A. Goudreau
(74) *Attorney, Agent, or Firm*—McKenna Long & Aldridge LLP

(57) ABSTRACT

A method of fabricating polycrystalline silicon thin film transistor according to the present invention includes: depositing a buffer layer on a substrate; depositing an amorphous silicon layer on the buffer layer with a predetermined thickness; crystallizing the deposited amorphous silicon layer by using a laser to form a polycrystalline silicon layer; etching the crystallized polycrystalline silicon layer to a predetermined thickness; curing the etched polycrystalline silicon layer; and patterning the cured polycrystalline silicon layer to form a semiconductor layer.

23 Claims, 7 Drawing Sheets active layer
thickness
300~500 Å active layer
thickness
1000~2000 Å

FABRICATION METHOD OF POLYCRYSTALLINE SILICON TFT

This application claims the benefit of Korean Patent Application No. 35577/2003, filed on Jun. 3, 2003, which is hereby incorporated by reference for all purposes as if fully set forth herein.

BACKGROUND OF THE INVENTION

1. Field of the Invention

The present invention relates to a fabrication method of a thin film transistor, and more particularly, to a fabrication method of a thin film transistor using polycrystalline silicon.

2. Description of the Related Art

Generally, a thin film transistor (hereinafter referred to as "TFT") includes a semiconductor active layer as one element thereof, which is of amorphous silicon or polycrystalline silicon.

The amorphous silicon may be deposited at a low temperature to form a thin film and is usually used in a switching device of a liquid crystal panel with a glass substrate having a low melting point.

When an amorphous silicon semiconductor layer containing hydrogen is used as a switching device and the semiconductor layer is exposed to light, a photocurrent is generated due to photoelectric conversion. Accordingly, current is generated in an off state. This fatally affects the operation of the switching device.

Even if the semiconductor layer is not exposed to light, many defects, such as dangling bonds that are a typical non-periodic lattice characteristic of amorphous silicon are generated and electrons do not flow naturally. As a result the performance of the device degrades. Accordingly, when forming a semiconductor layer using amorphous silicon, the electrical characteristics and reliability of the liquid crystal panel driving device deteriorate, and it is difficult to make the area of the display device large.

On the other hand, when polycrystalline silicon is used to form a semiconductor layer, the surface of the semiconductor layer has fewer defects. The operation speed of the TFT formed of polycrystalline silicon is about 100-200 times faster than that of the TFT formed of amorphous silicon.

Referring to FIGS. 1A through 1F, the process to fabricate a polycrystalline silicon TFT will be described. FIGS. 1A through 1F illustrate a method of fabricating a polycrystalline silicon TFT according to related art.

First, as shown in FIG. 1A, a buffer layer 102 is formed on a substrate 101. Here, the buffer layer 102 may be formed of one of insulating materials such as silicon oxide ($SiO_2$), silicon nitride ($SiN_x$), aluminum oxide ($Al_2O_3$) and the like. The buffer layer 102 provides a buffer between the substrate and the semiconductor layer to be formed later and prevents the substrate and the semiconductor layer from twisting because of nonuniform contact between the substrate and the semiconductor layer.

After that, an amorphous silicon layer 103 containing hydrogen is deposited on the buffer layer 102. The amorphous silicon layer 103 deposited on the buffer layer 102 is crystallized to form a semiconductor layer formed of polycrystalline silicon.

In general, to form the polycrystalline silicon layer, pure amorphous silicon is deposited with a thickness of about 500 Å and crystallized. A plasma chemical vapor deposition (CVD) or a low pressure CVD (LPCVD) may be used as a method to deposit an amorphous silicon layer.

There are a number of polycrystalline silicon forming methods using amorphous silicon, some of which are described below.

First, an amorphous silicon layer may be annealed at high temperature for a long time in a solid phase crystallization (SPC) method to form the polycrystalline silicon layer.

Second, metal may be deposited on the amorphous silicon in a metal induced crystallization (MIC) method to form the polycrystalline silicon layer, so that a large glass substrate may be used.

Third, polycrystalline silicon may be grown using a laser in laser annealing on the substrate on which an amorphous silicon layer is deposited.

The method of fabricating the TFT by using polycrystalline silicon layer will be described successively as follows.

Referring to FIG. 1B, the crystallized polycrystalline layer is patterned to form a semiconductor layer 103a and inorganic insulating film such as silicon nitride ($SiN_x$) or silicon oxide ($SiO_x$) may be deposited on an entire surface including the semiconductor layer 103a to form a first insulating film 104.

Then, as shown in FIG. 1C, a conductive material such as aluminum (Al) or Al alloy is deposited over the first insulating film 104 and patterned using photolithography to form a gate electrode 105 on a predetermined portion on the semiconductor layer 103a.

Ions are implanted into the semiconductor layer 103a by using the gate electrode 105 as a mask to form a source/drain region. The semiconductor layer 103a is masked by the gate electrode 105, and the area of the semiconductor layer 103a into which ions are not implanted into becomes channel region.

As shown in FIG. 1D, after implanting ions, an inorganic insulating film is deposited on an entire surface including the gate electrode 105 to form a second insulating film 106. The second insulating film 106 and the first insulating film 104 are selectively removed to form a contact hole through which a predetermined portion of the source/drain region is exposed.

Then, as shown in FIG. 1E, conductive material such as Al or Al alloy is deposited on the second insulating film 106 through the contact hole and patterned in photolithography to form a source electrode 107 and a drain electrode 108 connected to the source/drain regions through the contact hole.

Finally, as shown in FIG. 1F, a passivation film 109 is deposited on the source electrode 107 and the drain electrode 108. A contact hole is formed in a region of the drain electrode 108 on the passivation film 109 and a pixel electrode 110 is formed to connect the pixel electrode 110 to the drain electrode 108.

Meanwhile, the electrical characteristic of the polycrystalline silicon TFT is affected greatly by grain morphology. In other words, the electric field effect mobility of the polycrystalline silicon TFT is increased as the size of the grains is increased.

FIG. 2 illustrates the size of grains according to the thickness of the general crystallized polycrystalline silicon layer. FIG. 3 illustrates characteristics of the TFT according to the thickness of the general polycrystalline silicon layer.

As shown in FIG. 2, it is well known that the amorphous silicon that is thinly formed at a thickness of 300-500 Å and crystallized has a small grain size, while the amorphous silicon that is thickly formed at a thickness of 1000-2000 Å and crystallized has a large grain size. As shown in FIG. 3, the mobility of the TFT is increased as the thickness of the polycrystalline silicon layer is increased. It is thought that the increase of the mobility is because the factors which hinder electrons from moving due to the increase of the size of the grains and the reduction of the defects in the grains are decreased.

In the method where the amorphous silicon is thickly formed at the thickness of 1000-2000 Å and the size of the crystallized grains is increased to improve the device characteristics, other problems arise.

For instance, as shown in FIG. 3, off current $I_{off}$ increases as the polycrystalline silicon layer gets thicker. When the polycrystalline silicon layer is thick, the generation-recombination region increases and leakage current increases.

In addition, when the polycrystalline silicon layer is thick, the gate metal line can be easily disconnected due to a high aspect ratio of the semiconductor layer (in the case of coplanar structure).

SUMMARY OF THE INVENTION

Accordingly, the present invention is directed to a fabrication method of a polycrystalline silicon TFT that substantially obviates one or more problems due to limitations and disadvantages of the related art.

An advantage of the present invention to provide a fabrication method of a polycrystalline silicon TFT in which the grain morphology of the polycrystalline silicon layer is improved to thereby improve the device characteristics.

Additional features and advantages of the invention will be set forth in part in the description which follows, and in part will be apparent from the description, or may be learned from practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described, a method of fabricating polycrystalline silicon thin film transistor according to the present invention includes: depositing a buffer layer on a substrate; depositing an amorphous silicon layer on the buffer layer with a predetermined thickness; crystallizing the deposited amorphous silicon layer by using a laser to form a polycrystalline silicon layer; etching the crystallized polycrystalline silicon layer to a predetermined thickness; curing the etched polycrystalline silicon layer; and patterning the cured polycrystalline silicon layer to form a semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE ILLUSTRATED EMBODIMENTS

Reference will now be made in detail to embodiments of the present invention, an example of which is illustrated in the accompanying drawings.

FIGS. 4A through 4E illustrate a TFT that is fabricated according to a method of fabricating a polycrystalline silicon TFT according to the present invention.

Figure 1A:
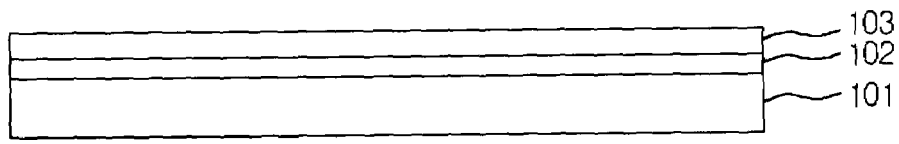
FIG. 1A through 1F illustrate a TFT fabricated according to a method of fabricating a polycrystalline silicon TFT according to related art.
Figure 1B:
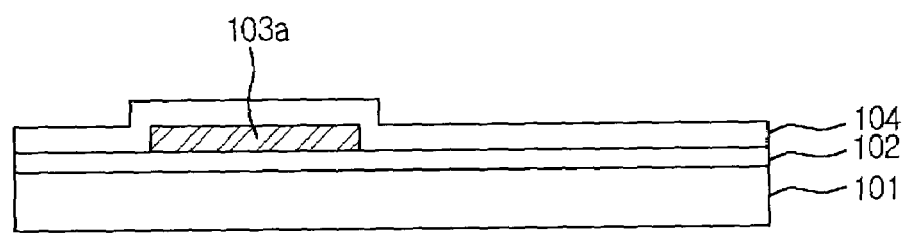
Figure 1C:
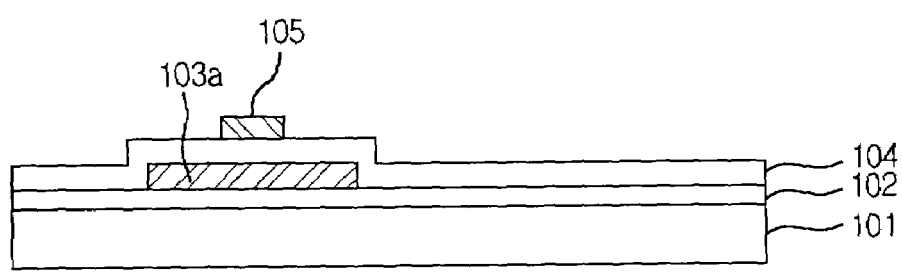
Figure 1D:
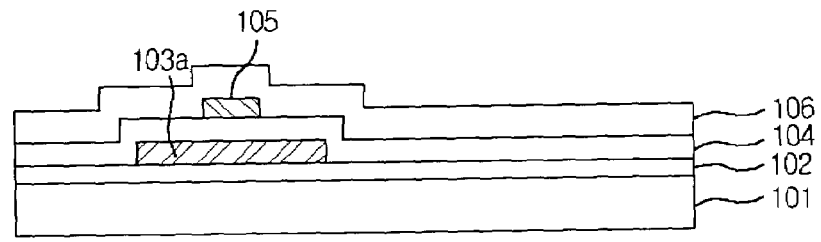
Figure 1E:
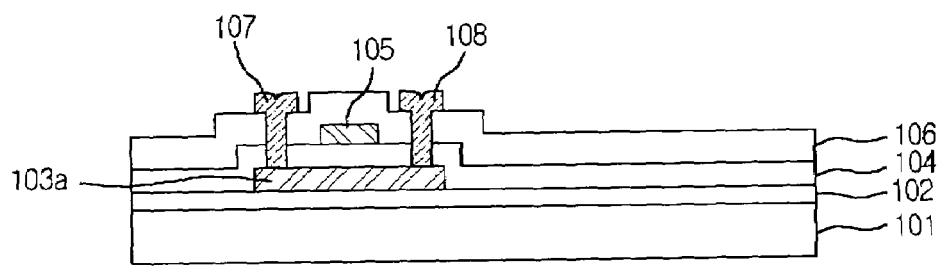
Figure 1F:
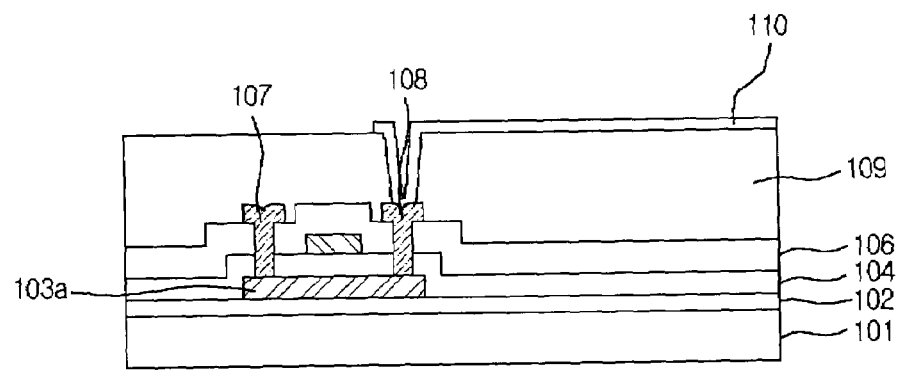
Figure 2:
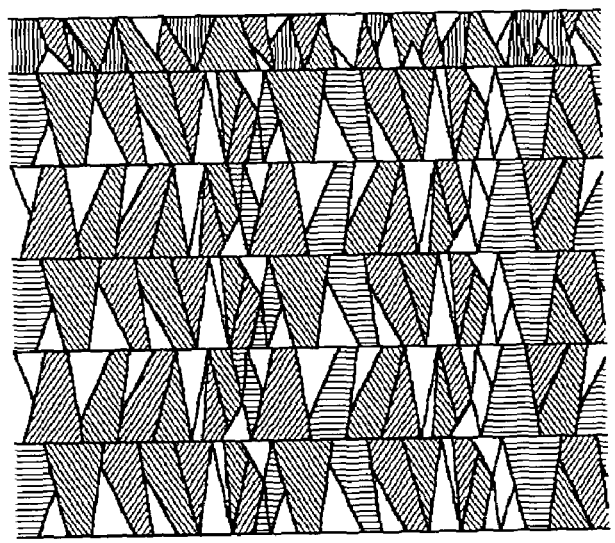
FIG. 2 illustrates a general the size of grains according to the thickness of a crystallized polycrystalline silicon layer.
Figure 2:
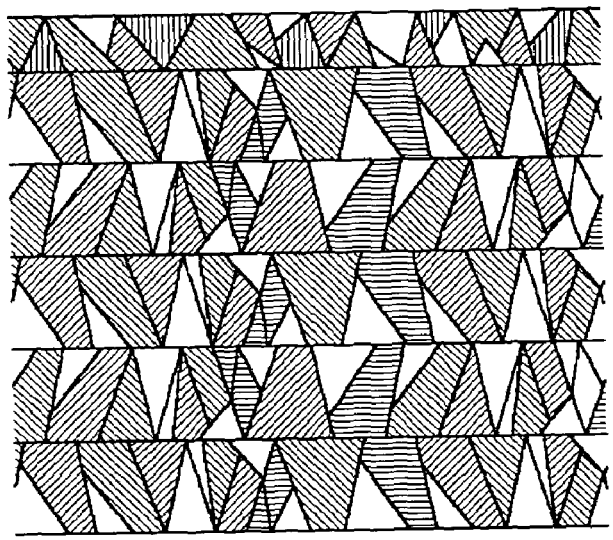
Figure 3:
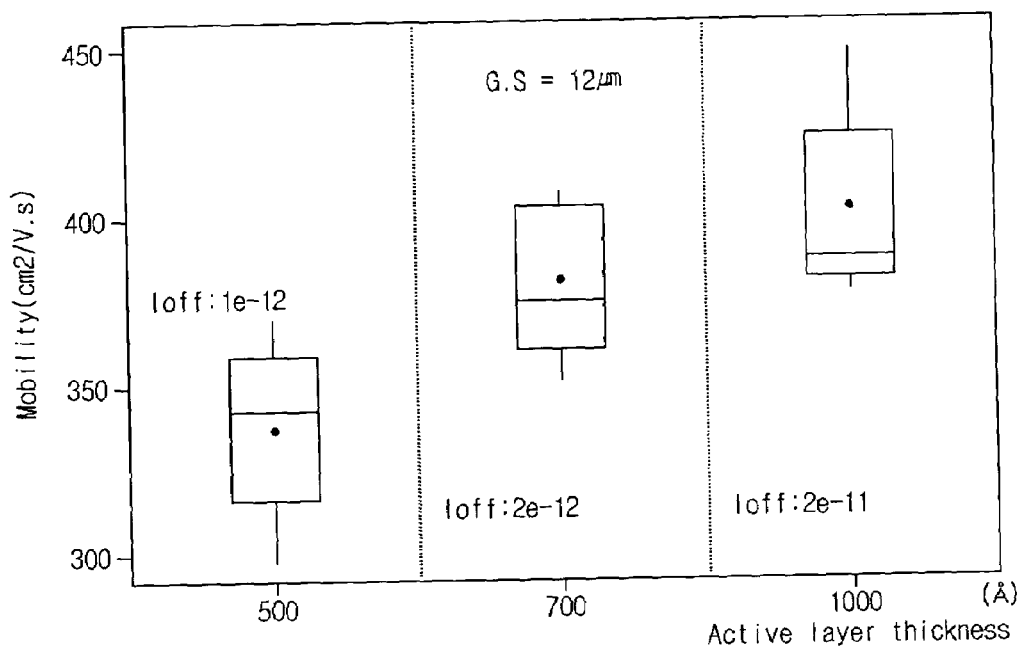
FIG. 3 illustrates a general the characteristic of the TFT according to the thickness of a polycrystalline silicon layer.
Figure 4A:
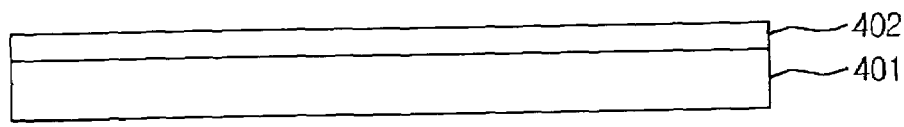
FIGS. 4A through 4E illustrate a TFT fabricated according to a method of fabricating a polycrystalline silicon TFT according to the present invention.

First, as shown in FIG. 4A, a buffer layer 402 is formed on a substrate 401. In general, the buffer layer 402 may be made of an insulating material such as a silicon oxide ($SiO_2$) film, a silicon nitride ($SiN_x$) film or an aluminum oxide ($Al_2O_3$) film. The buffer layer 402 provides a buffer between the substrate 401 and a semiconductor layer to be formed later and avoids twisting caused by nonuniform contact between the substrate 401 and the semiconductor layer.

Figure 4B:
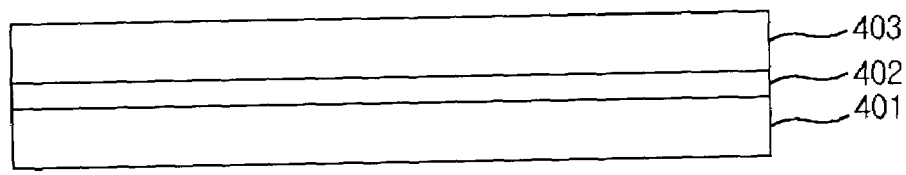

As shown in FIG. 4B, the intrinsic amorphous silicon layer 403 is deposited on the formed buffer layer 402 with thickness of about 700-10000 Å. The amorphous silicon layer 403 may be deposited by plasma chemical vapor deposition or LPCVD low pressure.

The amorphous silicon layer 403 is dehydrogenated by annealing. If not dehydrogenated, a surface of the crystalline thin film gets very tough so that the electrical characteristic degrades.

Figure 4C:
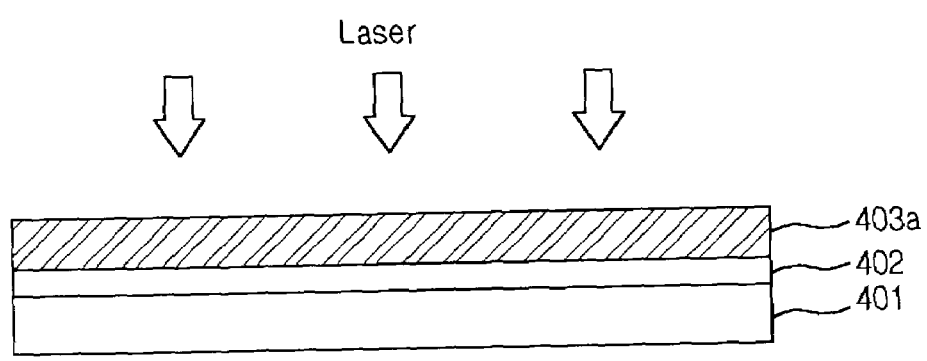

Subsequently, as shown in FIG. 4C, the deposited amorphous silicon 403 is crystallized to become a polycrystalline silicon layer 403a. A crystallization process using a laser may be used.

More particularly described, the crystallization process using the laser may be exemplified by an excimer laser annealing process using high power pulse laser or a sequential lateral solidification process.

In the excimer laser annealing process, strong energy pulses of short wavelength (for example, $\lambda=0.3$ μm) are projected to melt a thick silicon layer so that crystallization may be performed rapidly, and the thick silicon layer is crystallized uniformly to improve the mobility of a device.

Particularly, the short wavelength of the excimer may locally and finely anneal an object in short time, and a lower silicon layer is not thermally damaged because the energy concentration of a laser light is used.

The size of grains of polycrystalline silicon layer fabricated using excimer laser crystallization can be finely determined by varying the thickness of an amorphous silicon film, the density of ultraviolet irradiation caused by a laser, and the temperature of the lower substrate.

Then, a sequential lateral solidification process is performed using the fact that silicon grains grow on the boundary surface between liquid silicon and solid silicon perpendicular to the boundary surface. In the sequential lateral solidification process, the amount of laser energy and the irradiation range of the laser beam are properly adjusted, and silicon grains laterally grow a predetermined length so that an amorphous silicon thin film is crystallized.

Figure 4D:
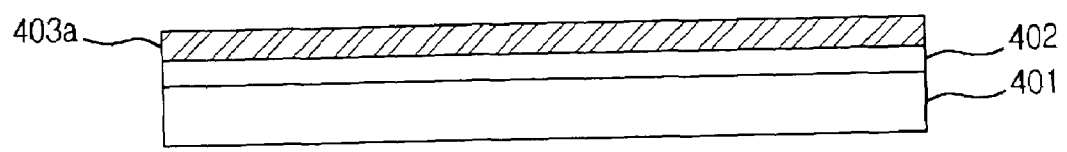

Next, as shown in FIG. 4D, the crystallized polycrystalline silicon layer 403a of thickness of about 700-10000 Å is etched to have thickness of about 100-600 Å.

When etching the crystallized polycrystalline silicon layer, the crystallized polycrystalline silicon layer is etched with respect to channel resistance according to thickness of the polycrystalline silicon layer so that the polycrystalline silicon layer is thicker than thickness needed to implement the on-current drive of the thin film transistor.

In addition, when etching the crystallized polycrystalline silicon layer, the crystallized polycrystalline silicon layer is etched with according to a process margin within which the polycrystalline silicon layer is etched in a subsequent contact hole formation process for contacting a source/drain electrode, and so that the polycrystalline silicon layer is thicker than a predetermined thickness.

The crystallized polycrystalline silicon layer may be thinly etched using a chemical mechanical polishing (CMP) process or an etch-back process. Methods, other than etching may also be used to reduce the thickness of the polycrystalline silicon layer according to the present invention.

The chemical mechanical polishing process is a combination process in which a mechanical polishing process and a chemical polishing process are combined. In the chemical mechanical polishing process, the mechanical performance and the chemical performance act simultaneously.

Figure 5:
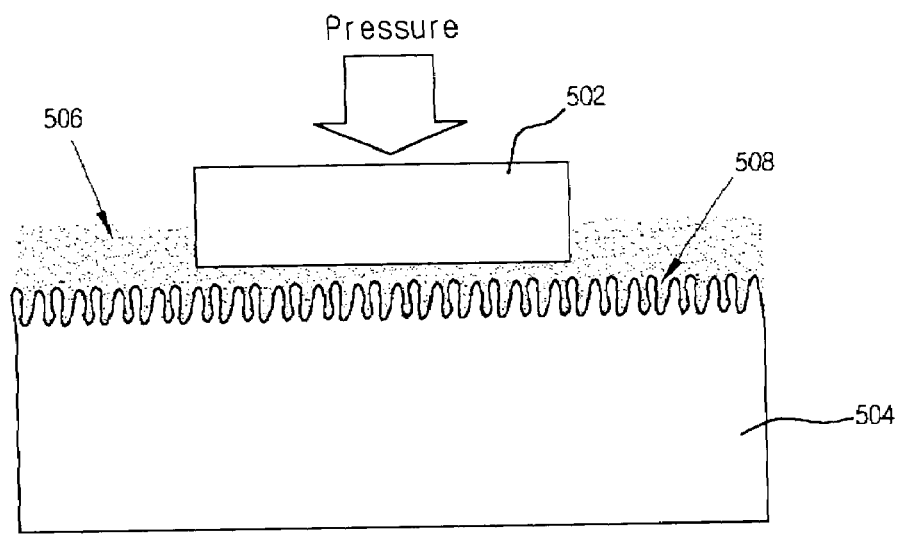
FIG. 5 illustrates a general chemical mechanical polishing process schematically.
Figure 6:
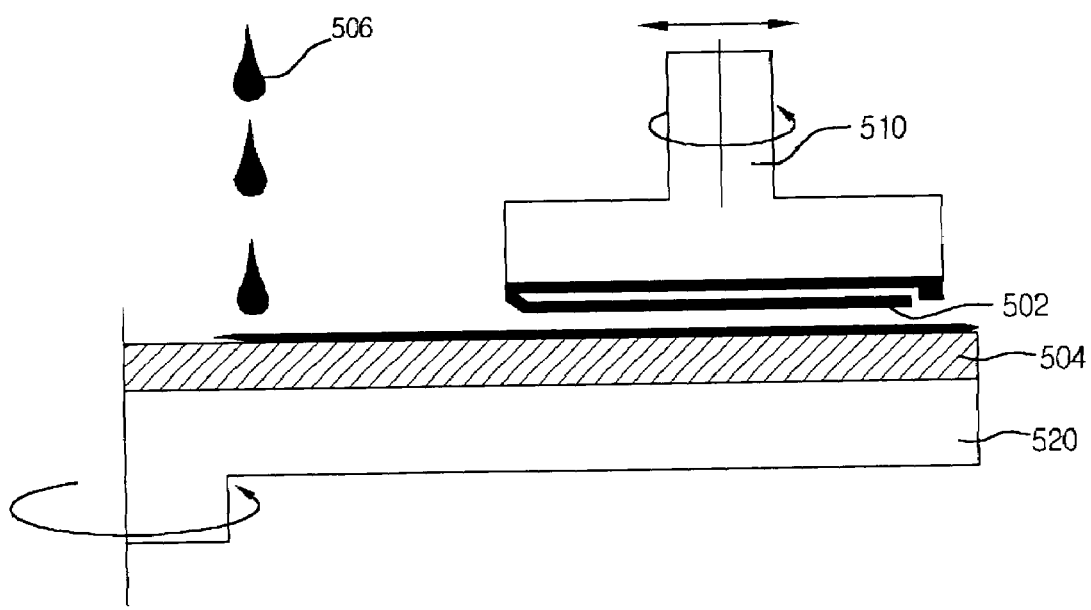
FIG. 6 illustrates a general chemical mechanical polishing equipment schematically.

FIG. 5 illustrates a general chemical mechanical polishing process schematically. FIG. 6 illustrates general chemical mechanical polishing equipment schematically. As shown in FIGS. 5 and 6, the substrate 502 is polished by a pad 504 and slurry 506. Here, in general, the polishing table 520 with the pad 504 rotates. The head 510 rotates and vibrates simultaneously and applies a predetermined pressure to the substrate 502.

The substrate 502 is installed on the head 510 using surface tension or vacuum. The surface of the substrate 502 and the pad 504 are placed in contact with each other, and the weight of the head 510 applies pressure. Here, the slurry 506 flows into the fine gap of the contacted surface. The polishing particles of the slurry 506 and the surface projections 508 of the pad 504 polish objects mechanically. The chemical component of the slurry 506 polishes the objects chemically.

In the chemical mechanical polishing process, the pad 504 is in contact with an upper portion of a projection on the substrate 502. Due to the applied pressure between the pad 504 and the substrate 502, the pressure is concentrated on this portion so that a comparatively higher surface removing speed is achieved. As the process proceeds, the projections are reduced. The entire surface of the substrate 502 is polished uniformly.

As described above, the crystallized polycrystalline silicon layer may be polished with the desired thickness using the chemical mechanical polishing process.

In addition, the crystallized polycrystalline silicon layer may be polished with the desired thickness using an etch-back process. The etch-back process is a method of etching without a mask. When forming a sidewall in a semiconductor process, it may be etched without any mask, and it may be etched without any mask so as to planarize after deposition process. All these are called an etch-back process.

Next, the step of curing the polycrystalline silicon layer 403a etched to a predetermined thickness is performed so as to cure the injured region of the surface of the polycrystalline silicon layer 403a. Either an annealing process using a furnace or an annealing process using a laser may be used as a curing process. Also a rapid thermal annealing (RTA) may be used as the curing process.

When the polycrystalline silicon layer 403a is etched using the chemical mechanical polishing process, it is usually annealed at about 400-500° C. When polycrystalline silicon layer 403a is etched using an etch-back process, the annealing using the laser or the rapid thermal annealing usually is performed.

Through the processes, the injured silicon on the etched polycrystalline silicon layer 403a is cured along a good quality crystal formed on a lower portion of the polycrystalline silicon layer 403a.

Figure 4E:
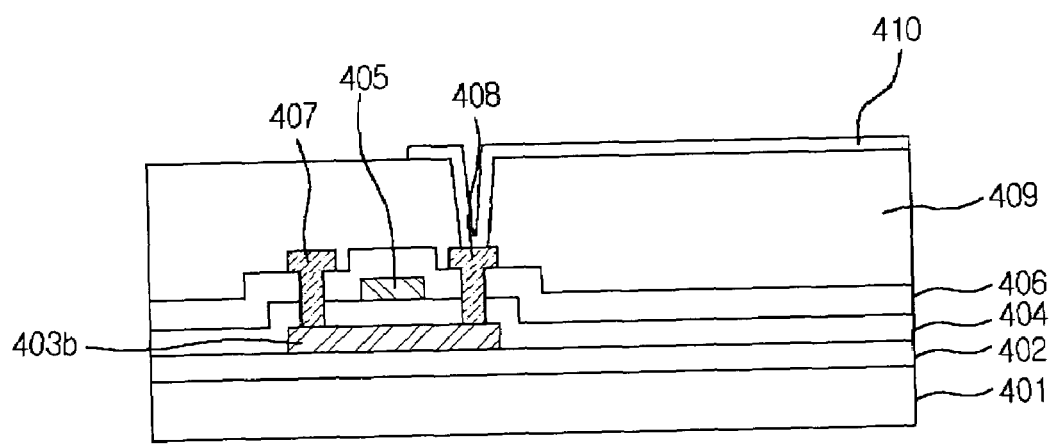

As shown in FIG. 4E, the cured polycrystalline silicon layer 403a is patterned to form the semiconductor layer 403b.

More particularly described, the crystallized polycrystalline silicon layer 403a is patterned to form a semiconductor layer 403b. An inorganic insulating film such as silicon nitride ($SiN_x$) or silicon oxide ($SiO_x$) may be deposited on the entire surface including the semiconductor layer 403b to form a first insulating film 404.

Then, the conductive material such as aluminum (Al) or Al alloy is deposited on the entire surface including the first insulating film 404 and patterned by a photolithography process to form a gate electrode 405 on a predetermined portion on the semiconductor layer 403b.

An impurity is implanted into the semiconductor layer 403b by using the gate electrode 405 as a mask to form source/drain regions. Here, the semiconductor layer which is masked by the gate electrode 405 and wherein ions are not implanted becomes a channel region.

After ions are implanted, an inorganic insulating film is deposited on the entire surface including the gate electrode 405 to form a second insulating film 406. The second insulating film 406 and the first insulating film 404 are selectively removed so that a contact holes is formed through which a predetermined portion of the source/drain region is exposed.

Then, the conductive material such as aluminum (Al) or Al alloy is deposited on the second insulating film 406 through the contact holes and patterned by the photolithography process to form a source electrode 407 and drain electrode 408 connected to source/drain regions through the contact hole.

Finally, after a passivation film 409 is deposited on the formed source electrode 407 and the drain electrode 408, a pixel electrode 410 is formed on the passivation film 409.

Accordingly, the semiconductor layer 403b formed by the above-mentioned method has grains which are large and thin so that electrical characteristics are improved.

In other words, as described above, according to the polycrystalline silicon TFT fabrication method of the present invention, the amorphous silicon layer is deposited thickly and crystallized to enlarge the size of its grains so that the characteristic of the device is improved.

In addition, according to the polycrystalline silicon TFT fabrication method of the present invention, a polycrystalline silicon layer is formed and etched to be thin so that the leakage current is prevented from increasing which is caused when polycrystalline silicon layer is thick. The polycrystalline silicon layer is formed to be thin so that the gate metal line is short despite a high aspect ratio.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of fabricating an active layer of a polycrystalline silicon thin film transistor, the method comprising:
   depositing a buffer layer on a substrate;
   depositing an amorphous silicon layer on the buffer layer with a first thickness;
   crystallizing the deposited amorphous silicon layer by using a laser to form a polycrystalline silicon layer;
   etching the crystallized polycrystalline silicon layer to a second thickness thinner than the first thickness;
   curing the etched polycrystalline silicon layer;
   patterning the cured polycrystalline silicon layer to form a semiconductor layer
   forming a first insulating layer on the semiconductor layer;
   forming a gate electrode on the first insulating layer;
   forming a second insulating layer on the gate electrode;
   forming first and second contact holes in the first and second insulating layers, the first and second contact holes exposing the semiconductor layer; and
   forming source and drain electrodes on the second insulating layer, the source and drain electrodes contacting the semiconductor layer through the first and second contact holes.

2. The method according to claim 1, wherein the first thickness is about 700-10000 Å.

3. The method according to claim 1, wherein the crystallizing uses an excimer laser.

4. The method according to claim 3, wherein an excimer laser crystalizing process uses one of an excimer laser process and a sequential lateral solidification process.

5. The method according to claim 1, wherein the crystallized polycrystalline silicon layer is etched to the second thickness according to a channel resistance, and wherein the second thickness is determined to achieve a desired on-current drive for the thin film transistor.

6. The method according to claim 1, wherein the crystallized polycrystalline silicon layer is etched in order to achieve a process margin for etching a subsequent contact hole to contact a source/drain electrode and wherein the etched polycrystalline silicon layer is thicker than a defined thickness.

7. The method according to claim 1, wherein the polycrystalline silicon layer is etched to a thickness of about 100-600 Å.

8. The method according to claim 1, wherein the crystallized polycrystalline silicon layer is etched to the second thickness by using a chemical mechanical polishing process.

9. The method according to claim 1, wherein the crystallized polycrystalline silicon layer is etched to the second thickness by using an etch-back process.

10. The method according to claim 1, wherein the etched polycrystalline silicon layer is cured at a temperature of about 400-500° C.

11. The method according to claim 1, wherein the etched polycrystalline silicon layer is cured using a laser annealing process.

12. The method according to claim 1, wherein the etched polycrystalline silicon layer is cured using a rapid thermal annealing process.

13. The method according to claim 1, further comprising:
    forming a passivation film on the formed source/drain electrode;
    forming a third contact hole in the passivation film to the drain electrode; and
    forming a pixel electrode connected electrically to the drain electrode through the third contact hole by depositing a transparent conductive film on the layers and patterning the transparent conductive film.

14. A method of fabricating an active layer of a polycrystalline silicon thin film transistor, the method comprising:
    depositing an amorphous silicon layer on a substrate at a first thickness;
    crystallizing the deposited amorphous silicon layer to form a polycrystalline silicon layer using a sequential lateral solidification (SLS) method;
    reducing the thickness of the crystallized polycrystalline silicon layer to a second thickness thinner than the first thickness, wherein the second thickness is at least determined by an on/off current ratio of the polycrystalline thin film transistor; and
    patterning the reduced polycrystalline silicon layer to form a semiconductor layer
    forming a first insulating layer on the semiconductor layer;
    forming a gate electrode on the first insulating layer;
    forming a second insulating layer on the gate electrode;
    forming first and second contact holes in the first and second insulating layers, the first and second contact holes exposing the semiconductor layer; and
    forming source and drain electrodes on the second insulating layer, the source and drain electrodes contacting the semiconductor layer through the first and second contact holes.

15. The method according to claim 14, wherein the first thickness is about 700-10000 Å.

16. The method according to claim 14, wherein crystallizing uses an excimer laser.

17. The method according to claim 14, further comprising curing the polycrystalline silicon layer having the second thickness.

18. The method according to claim 14, wherein the crystallized polycrystalline silicon layer is reduced to the second thickness according to a channel resistance, and wherein the second thickness is determined to achieve a desired on-current drive for the thin film transistor.

19. The method according to claim 14, wherein the crystallized polycrystalline silicon layer is reduced in order to achieve of a process margin for etching a subsequent contact hole to contact a source/drain electrode, and wherein the polycrystalline silicon layer is thicker than a defined thickness.

20. The method according to claim 14, the polycrystalline silicon layer is reduced to a thickness of about 100-600 Å.

21. The method according to claim 14, wherein the crystallized polycrystalline silicon layer is reduced to the second thickness by using a chemical mechanical polishing process.

22. The method according to claim 14, wherein the crystallized polycrystalline silicon layer is reduced to the second thickness by using an etch-back process.

23. The method according to claim 14, further comprising:
    forming a passivation film on the formed source/drain electrode;
    forming a third contact hole in the passivation film provided on the drain electrode; and
    forming a pixel electrode connected electrically to the drain electrode through the third contact hole by depositing a transparent conductive film on the layers and patterning the transparent conductive film.

* * * * *